US010496477B1

(12) United States Patent
Berke et al.

(10) Patent No.: US 10,496,477 B1
(45) Date of Patent: Dec. 3, 2019

(54) SYSTEM AND METHOD OF UTILIZING MEMORY MODULES

(71) Applicant: Dell Products L.P., Round Rock, TX (US)

(72) Inventors: Stuart Allen Berke, Austin, TX (US); Vadhiraj Sankaranarayanan, Austin, TX (US); Bhyrav M. Mutnury, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 29 days.

(21) Appl. No.: 15/987,190

(22) Filed: May 23, 2018

(51) Int. Cl.
H03M 13/00 (2006.01)
G06F 11/10 (2006.01)
H03M 13/35 (2006.01)
H03M 13/29 (2006.01)

(52) U.S. Cl.
CPC ..... G06F 11/1076 (2013.01); H03M 13/2906 (2013.01); H03M 13/356 (2013.01)

(58) Field of Classification Search
CPC ............ G06F 11/1068; G06F 12/0246; G06F 12/0802; G06F 13/28; G06F 2212/1036; G06F 2212/7211; G06F 11/1076; H03M 13/2906; H03M 13/356
See application file for complete search history.

(56) References Cited

U.S. PATENT DOCUMENTS 8,429,492 B2 4/2013 Yoon et al.

OTHER PUBLICATIONS

Li, Qingsong, and Utpal Patel. "Memory Reliability, Availability, and Serviceability Features." www.dell.com/powersolutions, 2005; 4 pages.
Cui, Neo. "Demonstrating the Memory RAS Features of Lenovo ThinkSystem Servers." Lenovo Press, Oct. 31, 2017; 25 pages.
JEDEC. "Committee Letter Ballot." DDR5 Full Spec Draft Rev0.1, 2011; 321 pages.
JEDEC. "JEDEC Standard—DDR4 SDRAM." JESD79-4B, Jun. 2017, JEDEC Solid State Technology Association; 262 pages.

Primary Examiner — Guerrier Merant
(74) Attorney, Agent, or Firm — Baker Botts L.L.P.

(57) ABSTRACT

In one or more embodiments, one or more systems, methods, and/or processes may determine that a first memory unit (MU) and a second MU of a first channel of a memory module are associated with an issue; may configure a control device to utilize a third MU in place of the first MU; and may configure the control device to utilize a fourth MU, of a second channel of the memory module, in place of the second MU. In one or more embodiments, multiple MUs of the first channel, other than the first and second MUs, may store a first portion of data; the fourth MU may store a second portion of the data; the multiple MUs, other than the first and second MUs, may provide the first portion of the data to a processor; and the fourth MU may provide the second portion of the data to the processor.

20 Claims, 9 Drawing Sheets

SYSTEM AND METHOD OF UTILIZING MEMORY MODULES

BACKGROUND

Field of the Disclosure

This disclosure relates generally to information handling systems and more particularly to utilizing memory modules of information handling systems.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

SUMMARY

In one or more embodiments, one or more systems, methods, and/or processes may determine that a first memory unit and a second memory unit of a first channel, of a memory module, are associated with an issue; may configure a control device of the memory module to utilize a third memory unit, of the first channel, in place of the first memory unit; may configure the control device to utilize a fourth memory unit, of a second channel of the memory module, in place of the second memory unit; may receive at least a first portion of data via the first channel; store the at least the first portion of the data via multiple memory units of the first channel, other than the first memory unit and the second memory unit; may receive a second portion of the data via the second channel; may store the second portion of the data via the fourth memory unit; may receive a read command; may provide the first portion of the data to a processor via the multiple memory units of the first channel, other than the first memory unit and the second memory unit, via the first channel; and may provide the second portion of the data to the processor via the fourth memory unit and the second channel.

In one or more embodiments, before determining that the first memory unit and the second memory unit are associated with the issue, the third memory module may have been utilized with error codes associated with the first channel and the fourth memory module may have been utilized with error codes associated with the second channel. In one or more embodiments, before configuring the control device to utilize the fourth memory unit in place of the second memory unit, the error codes associated with the second channel may have been of a first strength. In one or more embodiments, after configuring the control device to utilize the fourth memory unit in place of the second memory unit, additional error codes associated with the second channel may be of a second strength, lesser than the first strength. In one or more embodiments, the processor may include a memory controller. For example, the memory controller may receive the first portion of the data from the first channel; may receive the second portion of the data from the second channel; may combine the first portion of the data and the second portion of the data; and may provide the data to a processor core of the processor. In one or more embodiments, the one or more systems, methods, and/or processes may further configure an input/output director of the memory controller to combine the first portion of the data and the second portion of the data. For example, the memory controller may be further configured to receive the data from the processing core.

BRIEF DESCRIPTION OF THE DRAWINGS

For a more complete understanding of the present disclosure and its features/advantages, reference is now made to the following description, taken in conjunction with the accompanying drawings, which are not drawn to scale, and in which.

DETAILED DESCRIPTION

Figure 1:
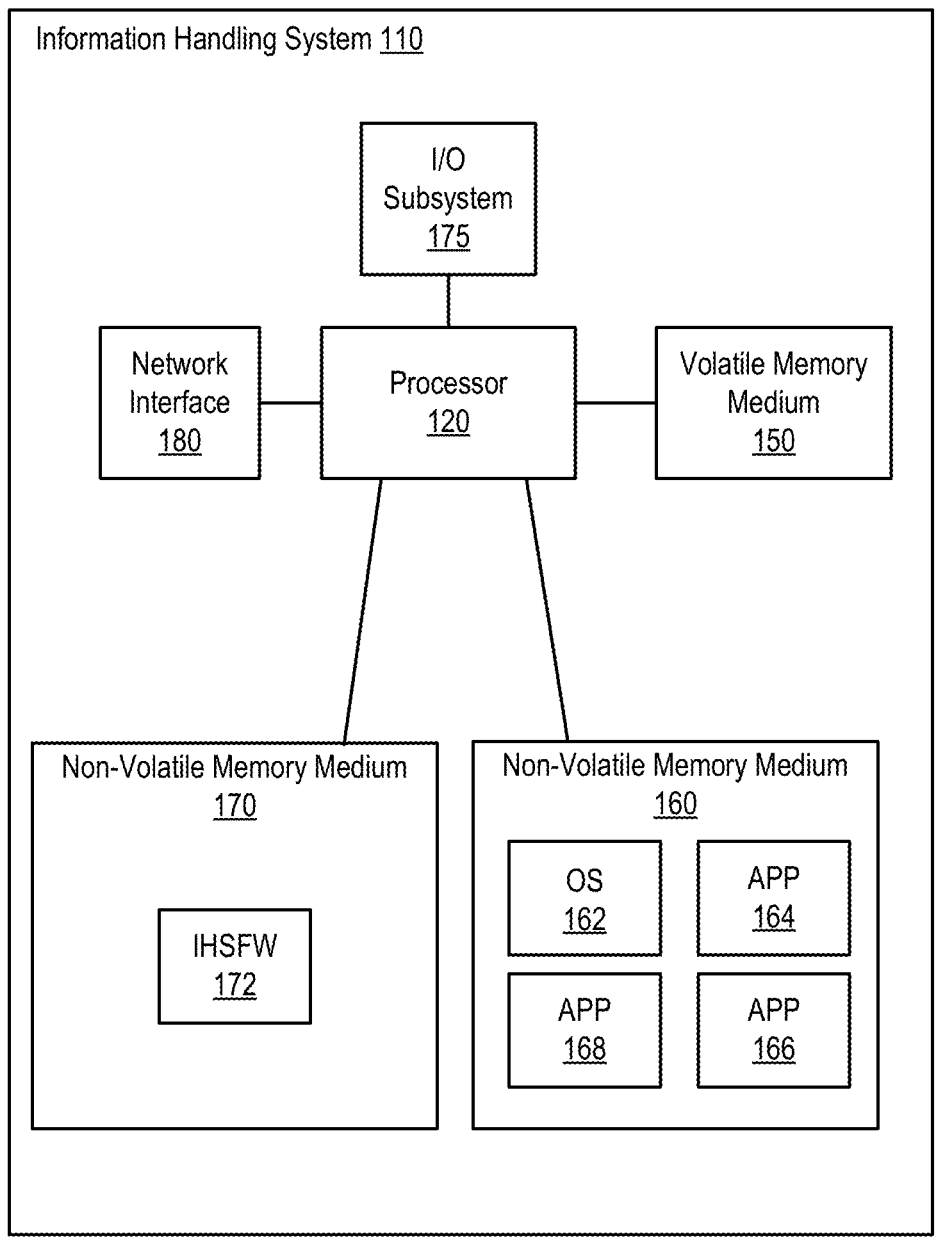
FIG. 1 illustrates an example of an information handling system, according to one or more embodiments.

In the following description, details are set forth by way of example to facilitate discussion of the disclosed subject matter. It should be apparent to a person of ordinary skill in the field, however, that the disclosed embodiments are examples and not exhaustive of all possible embodiments.

As used herein, a reference numeral refers to a class or type of entity, and any letter following such reference numeral refers to a specific instance of a particular entity of that class or type. Thus, for example, a hypothetical entity referenced by '12A' may refer to a particular instance of a particular class/type, and the reference '12' may refer to a collection of instances belonging to that particular class/type or any one instance of that class/type in general.

In one or more embodiments, a memory module may include multiple channels. For example, the multiple channels may be or include independent multiple channels. For instance, the multiple channels may be trained independently of one another. In one or more embodiments, a memory module interface may be or include multi-drop singled-ended interface. For example, a command address and data lines may be single-ended. In one or more embodiments, a high speed interface may be or include a point to point interface, a differential pair interface and/or a serializer/deserializer (SerDes) interface, among others. In one or more embodiments, a memory unit of a memory module may be susceptible to noise (e.g., interference such as radio frequency interference, submolecular particle interference, subatomic particle interference, etc.). For example, as a size of a memory unit decreases, a susceptibility of the memory unit to noise may increase. In one or more embodiments, a memory unit of a memory module may be susceptible to aging. For example, a memory unit may fail after an amount of time of utilization. For instance, utilization of a memory unit may induce wear-out of one or more junctions of the memory unit.

In one or more embodiments, one or more error corrections codes (ECCs) may be utilized to increase a robustness of a memory unit. For example, a memory module that includes multiple memory units may receive data and an error correction code (ECC). For instance, an ECC may decrease one or more losses of data integrity as one or more memory units become more susceptible to noise and/or other issues. In one or more embodiments, a processor provided error detection and/or error correction may not be available if there is a failure of multiple memory units on a channel of a memory module. In one or more embodiments, if a failure of one or more multiple memory units on a first channel of a memory module occurs, one or more memory modules of a second channel, different from the first channel, of the memory module may be utilized.

In one or more embodiments, it may be determined that a memory unit of a memory module has or is associated with an issue. For example, determining that the memory unit has or is associated with an issue may include determining that the memory unit is malfunctioning or has failed. In one or more embodiments, another memory unit may utilized in place of the memory unit that has or is associated with an issue. For example, the other memory unit may be utilized with one or more error correction codes. For instance, the other memory unit may be one of multiple memory units utilized with one or more error correction codes. In one or more embodiments, if the other memory unit is re-tasked with storing and/or providing data, a strength of utilizing error correction codes may be reduced. For example, the other memory unit may be or include a first ECC memory unit of multiple ECC memory units. For instance, the first ECC memory unit and a second ECC memory unit of the multiple ECC memory units may be utilized with error correction codes. In one or more embodiments, the first ECC memory unit and the second ECC memory unit may be utilized with eight-bit error correction codes. For example, if the first ECC memory unit is re-tasked with storing and/or providing data, the second ECC memory unit may be utilized with four-bit error correction codes. For instance, a four-bit error correction code may be of a lesser strength than an eight-bit error correction code. In one or more embodiments, re-tasking an ECC memory unit with storing and/or providing data may be performed during operation (e.g., run time) of an information handling system. In one or more embodiments, re-tasking an ECC memory unit with storing and/or providing data may be performed during a next boot-up of an information handling system.

Turning now to FIG. 1, an example of an information handling system is illustrated, according to one or more embodiments. An information handling system (IHS) 110 may include a hardware resource or an aggregate of hardware resources operable to compute, classify, process, transmit, receive, retrieve, originate, switch, store, display, manifest, detect, record, reproduce, handle, and/or utilize various forms of information, intelligence, or data for business, scientific, control, entertainment, or other purposes, according to one or more embodiments. For example, IHS 110 may be a personal computer, a desktop computer system, a laptop computer system, a server computer system, a mobile device, a tablet computing device, a personal digital assistant (PDA), a consumer electronic device, an electronic music player, an electronic camera, an electronic video player, a wireless access point, a network storage device, or another suitable device and may vary in size, shape, performance, functionality, and price. In one or more embodiments, a portable IHS 110 may include or have a form factor of that of or similar to one or more of a laptop, a notebook, a telephone, a tablet, and a PDA, among others. For example, a portable IHS 110 may be readily carried and/or transported by a user (e.g., a person). In one or more embodiments, components of IHS 110 may include one or more storage devices, one or more communications ports for communicating with external devices as well as various input and output (I/O) devices, such as a keyboard, a mouse, and a video display, among others. In one or more embodiments, IHS 110 may include one or more buses operable to transmit communication between or among two or more hardware components. In one example, a bus of IHS 110 may include one or more of a memory bus, a peripheral bus, and a local bus, among others. In another example, a bus of IHS 110 may include one or more of a Micro Channel Architecture (MCA) bus, an Industry Standard Architecture (ISA) bus, an Enhanced ISA (EISA) bus, a Peripheral Component Interconnect (PCI) bus, HyperTransport (HT) bus, an inter-integrated circuit (I²C) bus, a serial peripheral interface (SPI) bus, a low pin count (LPC) bus, an enhanced serial peripheral interface (eSPI) bus, a universal serial bus (USB), a system management bus (SMBus), and a Video Electronics Standards Association (VESA) local bus, among others.

In one or more embodiments, IHS 110 may include firmware that controls and/or communicates with one or more hard drives, network circuitry, one or more memory devices, one or more I/O devices, and/or one or more other peripheral devices. For example, firmware may include software embedded in an IHS component utilized to perform tasks. In one or more embodiments, firmware may be stored in non-volatile memory, such as storage that does not lose stored data upon loss of power. In one example, firmware associated with an IHS component may be stored in non-volatile memory that is accessible to one or more IHS components. In another example, firmware associated with an IHS component may be stored in non-volatile memory that may be dedicated to and includes part of that component. For instance, an embedded controller may include firmware that may be stored via non-volatile memory that may be dedicated to and includes part of the embedded controller.

As shown, IHS 110 may include a processor 120, a volatile memory medium 150, non-volatile memory media 160 and 170, an I/O subsystem 175, and a network interface 180. As illustrated, volatile memory medium 150, non-volatile memory media 160 and 170, I/O subsystem 175, and network interface 180 may be communicatively coupled to processor 120.

In one or more embodiments, one or more of volatile memory medium 150, non-volatile memory media 160 and 170, I/O subsystem 175, and network interface 180 may be communicatively coupled to processor 120 via one or more buses, one or more switches, and/or one or more root complexes, among others. In one example, one or more of volatile memory medium 150, non-volatile memory media 160 and 170, I/O subsystem 175, and network interface 180 may be communicatively coupled to processor 120 via one or more PCI-Express (PCIe) root complexes. In another example, one or more of an I/O subsystem 175 and a network interface 180 may be communicatively coupled to processor 120 via one or more PCIe switches.

In one or more embodiments, the term "memory medium" may mean a "storage device", a "memory", a "memory device", a "tangible computer readable storage medium", and/or a "computer-readable medium". For example, computer-readable media may include, without limitation, storage media such as a direct access storage device (e.g., a hard disk drive, a floppy disk, etc.), a sequential access storage device (e.g., a tape disk drive), a compact disk (CD), a CD-ROM, a digital versatile disc (DVD), a random access memory (RAM), a read-only memory (ROM), a one-time programmable (OTP) memory, an electrically erasable programmable read-only memory (EEPROM), and/or a flash memory, a solid state drive (SSD), or any combination of the foregoing, among others.

In one or more embodiments, one or more protocols may be utilized in transferring data to and/or from a memory medium. For example, the one or more protocols may include one or more of small computer system interface (SCSI), Serial Attached SCSI (SAS) or another transport that operates with the SCSI protocol, advanced technology attachment (ATA), serial ATA (SATA), a USB interface, an Institute of Electrical and Electronics Engineers (IEEE) 1394 interface, a Thunderbolt interface, an advanced technology attachment packet interface (ATAPI), serial storage architecture (SSA), integrated drive electronics (IDE), or any combination thereof, among others.

Volatile memory medium 150 may include volatile storage such as, for example, RAM, DRAM (dynamic RAM), EDO RAM (extended data out RAM), SRAM (static RAM), etc. One or more of non-volatile memory media 160 and 170 may include nonvolatile storage such as, for example, a read only memory (ROM), a programmable ROM (PROM), an erasable PROM (EPROM), an electrically erasable PROM, NVRAM (non-volatile RAM), ferroelectric RAM (FRAM), a magnetic medium (e.g., a hard drive, a floppy disk, a magnetic tape, etc.), optical storage (e.g., a CD, a DVD, a BLU-RAY disc, etc.), flash memory, a SSD, etc. In one or more embodiments, a memory medium can include one or more volatile storages and/or one or more nonvolatile storages.

In one or more embodiments, network interface 180 may be utilized in communicating with one or more networks and/or one or more other information handling systems. In one example, network interface 180 may enable IHS 110 to communicate via a network utilizing a suitable transmission protocol and/or standard. In a second example, network interface 180 may be coupled to a wired network. In a third example, network interface 180 may be coupled to an optical network. In another example, network interface 180 may be coupled to a wireless network.

In one or more embodiments, network interface 180 may be communicatively coupled via a network to a network storage resource. For example, the network may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, an Internet or another appropriate architecture or system that facilitates the communication of signals, data and/or messages (generally referred to as data). For instance, the network may transmit data utilizing a desired storage and/or communication protocol, including one or more of Fibre Channel, Frame Relay, Asynchronous Transfer Mode (ATM), Internet protocol (IP), other packet-based protocol, Internet SCSI (iSCSI), or any combination thereof, among others.

In one or more embodiments, processor 120 may execute processor instructions in implementing one or more systems, flowcharts, methods, and/or processes described herein. In one example, processor 120 may execute processor instructions from one or more of memory media 150-170 in implementing one or more systems, flowcharts, methods, and/or processes described herein. In another example, processor 120 may execute processor instructions via network interface 180 in implementing one or more systems, flowcharts, methods, and/or processes described herein.

In one or more embodiments, processor 120 may include one or more of a system, a device, and an apparatus operable to interpret and/or execute program instructions and/or process data, among others, and may include one or more of a microprocessor, a microcontroller, a digital signal processor (DSP), an application specific integrated circuit (ASIC), and another digital or analog circuitry configured to interpret and/or execute program instructions and/or process data, among others. In one example, processor 120 may interpret and/or execute program instructions and/or process data stored locally (e.g., via memory media 150-170 and/or another component of IHS 110). In another example, processor 120 may interpret and/or execute program instructions and/or process data stored remotely (e.g., via a network storage resource).

In one or more embodiments, I/O subsystem 175 may represent a variety of communication interfaces, graphics interfaces, video interfaces, user input interfaces, and/or peripheral interfaces, among others. For example, I/O subsystem 175 may include one or more of a touch panel and a display adapter, among others. For instance, a touch panel may include circuitry that enables touch functionality in conjunction with a display that is driven by a display adapter.

As shown, non-volatile memory medium 160 may include an operating system (OS) 162, and applications (APPs) 164-168. In one or more embodiments, one or more of OS 162 and APPs 164-168 may include processor instructions executable by processor 120. In one example, processor 120 may execute processor instructions of one or more of OS 162 and APPs 164-168 via non-volatile memory medium 160. In another example, one or more portions of the processor instructions of the one or more of OS 162 and APPs 164-168 may be transferred to volatile memory medium 150, and processor 120 may execute the one or more portions of the processor instructions of the one or more of OS 162 and APPs 164-168 via volatile memory medium 150.

As illustrated, non-volatile memory medium 170 may include information handling system firmware (IHSFW) 172. In one or more embodiments, IHSFW 172 may include processor instructions executable by processor 120. For example, IHSFW 172 may include one or more structures and/or one or more functionalities of one or more of a basic input/output system (BIOS), an Extensible Firmware Interface (EFI), a Unified Extensible Firmware Interface (UEFI), and an Advanced Configuration and Power Interface (ACPI), among others. In one instance, processor 120 may execute processor instructions of IHSFW 172 via non-volatile memory medium 170. In another instance, one or more portions of the processor instructions of IHSFW 172 may be transferred to volatile memory medium 150, and processor 120 may execute the one or more portions of the processor instructions of IHSFW 172 via volatile memory medium 150.

In one or more embodiments, OS 162 may include a management information exchange. In one example, the management information exchange may permit multiple components to exchange management information associated with managed elements and/or may permit control and/or management of the managed elements. In another example, the management information exchange may include a driver and/or a driver model that may provide an OS interface through which managed elements (e.g., elements of IHS 110) may provide information and/or notifications, among others. In one instance, the management information exchange may be or include a Windows Management Interface (WMI) for ACPI (available from Microsoft Corporation). In another instance, the management information exchange may be or include a Common Information Model (CIM) (available via the Distributed Management Task Force). In one or more embodiments, the management information exchange may include a combination of the WMI and the CIM. For example, WMI may be and/or may be utilized as an interface to the CIM. For instance, the WMI may be utilized to provide and/or send CIM object information to OS 162.

In one or more embodiments, processor 120 and one or more components of IRS 110 may be included in a system-on-chip (SoC). For example, the SoC may include processor 120 and a platform controller hub (not specifically illustrated).

Figure 2A:
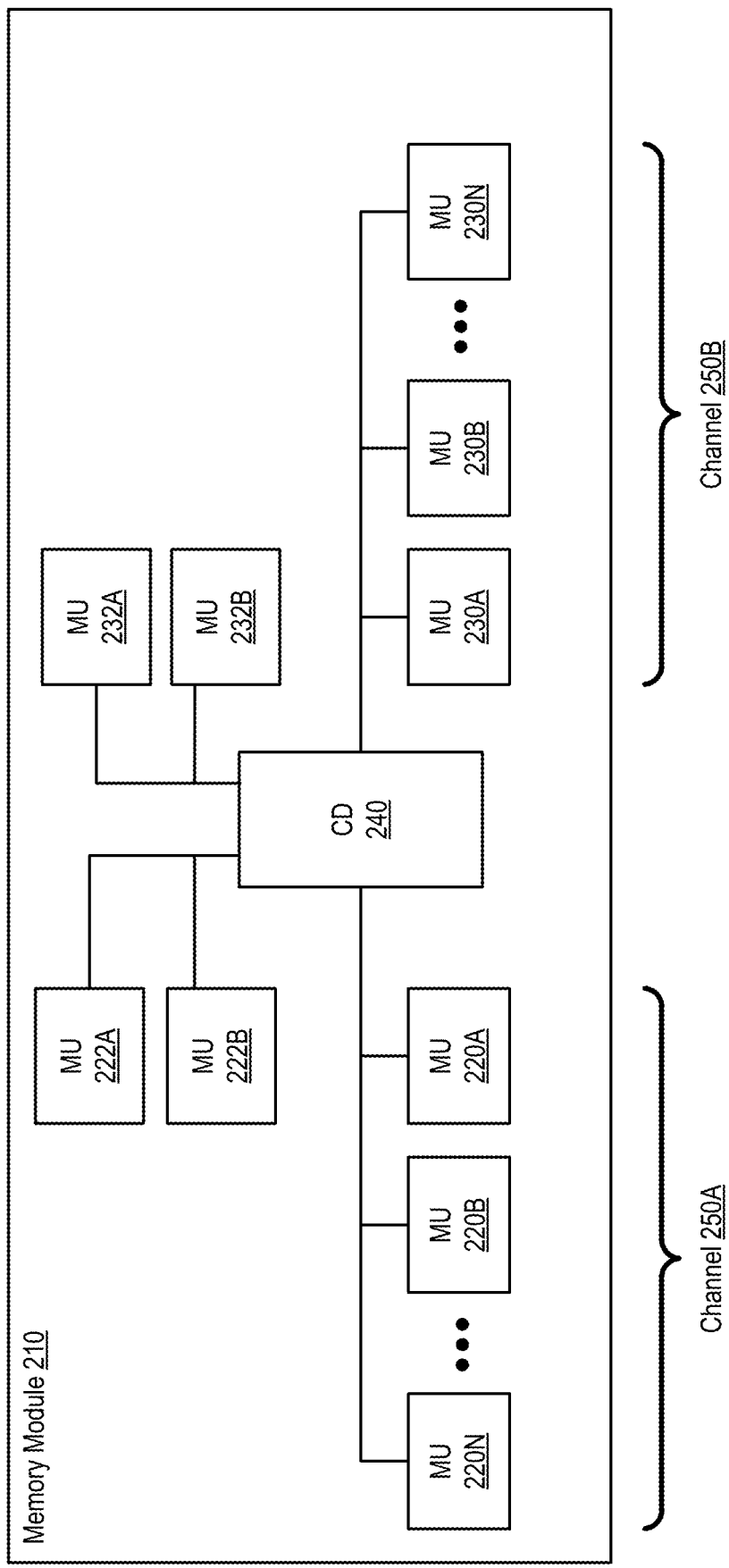
FIG. 2A illustrates an example of a memory module, according to one or more embodiments.

Turning now to FIG. 2A, an example of a memory module is illustrated, according to one or more embodiments. As shown, a memory module 210 may include memory units (MUs) 220A-220N and MUs 230A-230N coupled to a control device (CD) 240. In one or more embodiments, MUs 220A-220N and MUs 230A-230N may be utilized to store data. As illustrated, memory module 210 may include MUs 222A and 222B and MUs 232A and 232B coupled to CD 240. In one or more embodiments, CD 240 may be or include a register control device. In one or more embodiments, memory module 210 may be or include a dual in-line memory module (DIMM). For example, a memory unit (MU) of memory module 210 may be or include random access memory. In one instance, the random access memory may be or include dynamic random-access memory (DRAM). In another instance, the random access memory may be or include static random-access memory (SRAM).

In one or more embodiments, memory module 210 may include multiple channels. As shown, a channel 250A of memory module 210 may include MUs 220A-220N. As illustrated, a channel 250B of memory module 210 may include MUs 230A-230N. In one or more embodiments, memory module 210 may include MUs that may be utilized with error correction codes. In one example, MUs 222A and 222B may be utilized with error correction codes associated with channel 250A. For instance, channel 250A may include MUs 222A and 222B. In another example, MUs 232A and 232B may be utilized with error correction codes associated with channel 250B. For instance, channel 250B may include MUs 232A and 232B. In one or more embodiments, an error correction code may include a number of bits. For example, an error correction code may include eight bits. In one instance, MUs 222A and 222B may be utilized with an eight-bit error correction code associated with channel 250A. In another instance, MUs 232A and 232B may be utilized with an eight-bit error correction code associated with channel 250B.

Figure 2B:
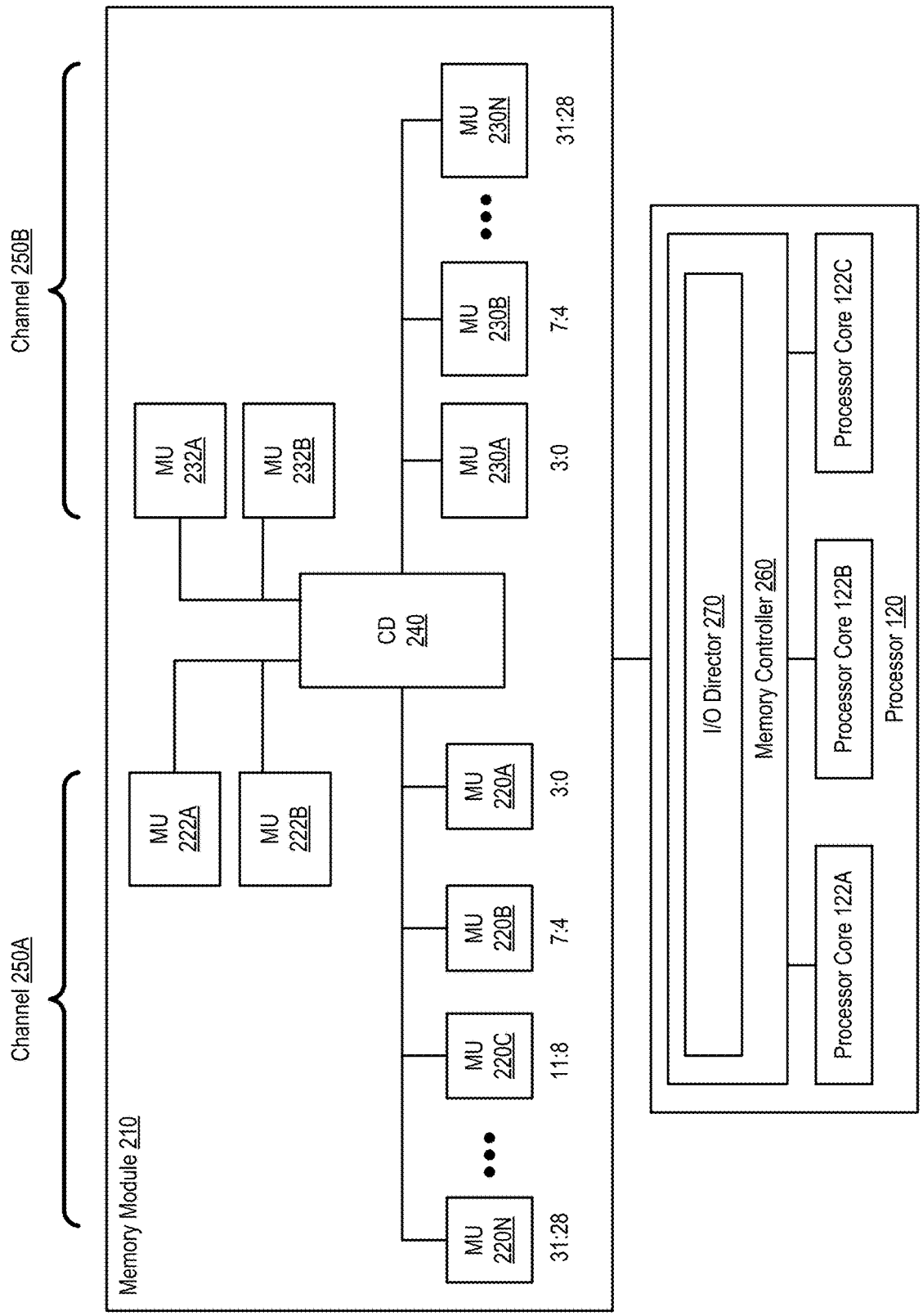
FIG. 2B illustrates an example of a memory module coupled to a processor, according to one or more embodiments.

Turning now to FIG. 2B, an example of a memory module coupled to a processor is illustrated, according to one or more embodiments. As shown, memory module 210 may be coupled to processor 120. In one or more embodiments, volatile memory medium 150 may include one or more memory modules 210. As illustrated, processor 120 may include processor cores 122A-122C and a memory controller 260. As shown, memory controller 260 may include an I/O director 270. As illustrated, memory controller 260 may be coupled to processor cores 122A-122C.

As illustrated, MU 220A may store bits 3:0 of data associated with channel 250A, MU 220B may store bits 7:4 of data associated with channel 250A, MU 220C may store bits 11:8 of data associated with channel 250A, other MUs may store bits 30:12 of data associated with channel 250A, and MU 220N may store bits 31:28 of data associated with channel 250A. As shown, MU 230A may store bits 3:0 of data associated with channel 250B, MU 230B may store bits 7:4 of data associated with channel 250B, other MUs may store bits 30:8 of data associated with channel 250B, and MU 230N may store bits 31:28 of data associated with channel 250B.

In one or more embodiments, a MU 222 and a MU 232 may receive data via respective channels 250A and 250B. In one example, MUs 222A and 222B may receive data channel 250A. For instance, the data may include error correction code data. In another example, MUs 232A and 232B may receive data channel 250B. For instance, the data may include error correction code data.

Figure 3A:
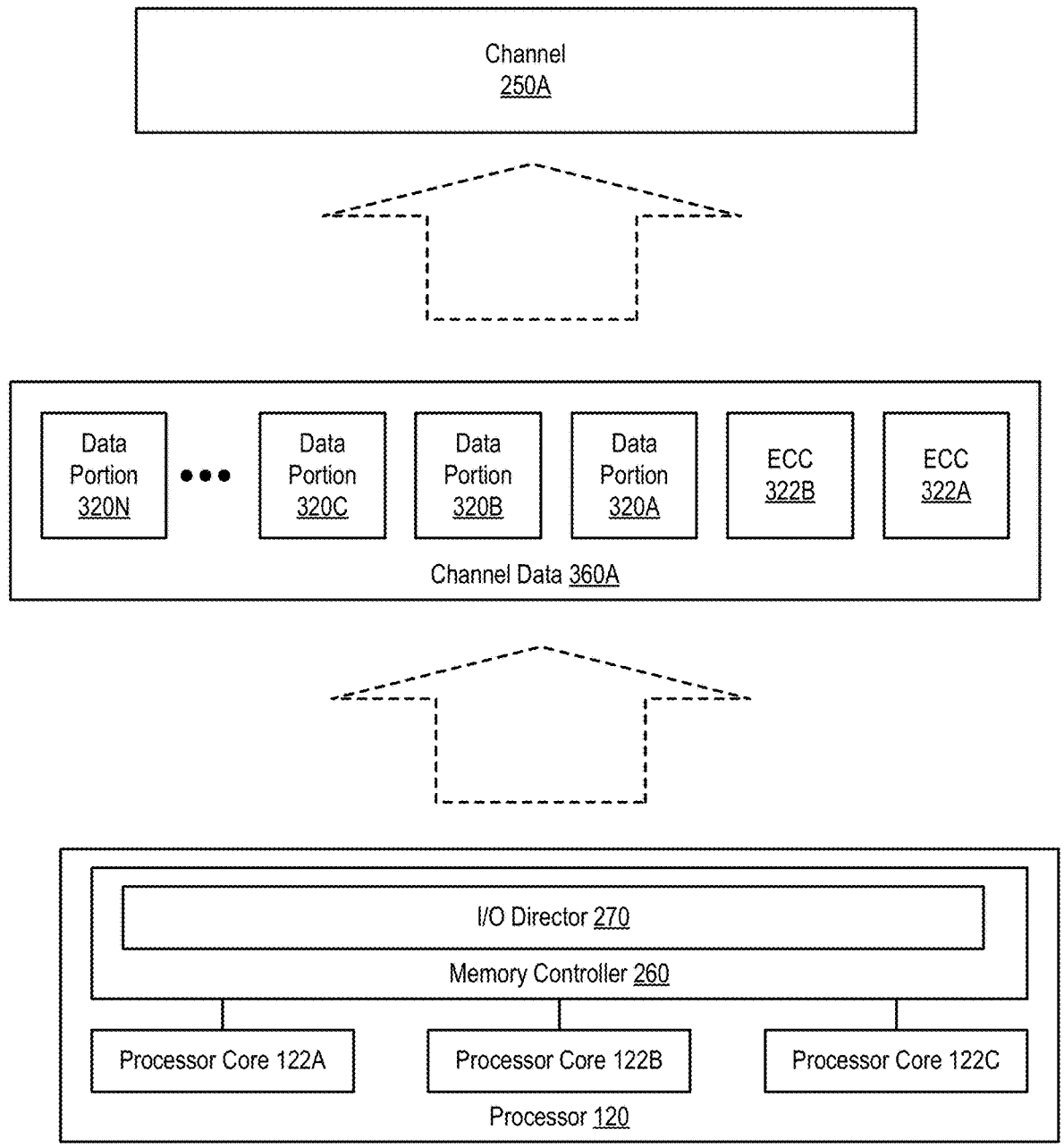
FIGS. 3A and 3B illustrate examples of channel data, according to one or more embodiments.
Figure 3B:
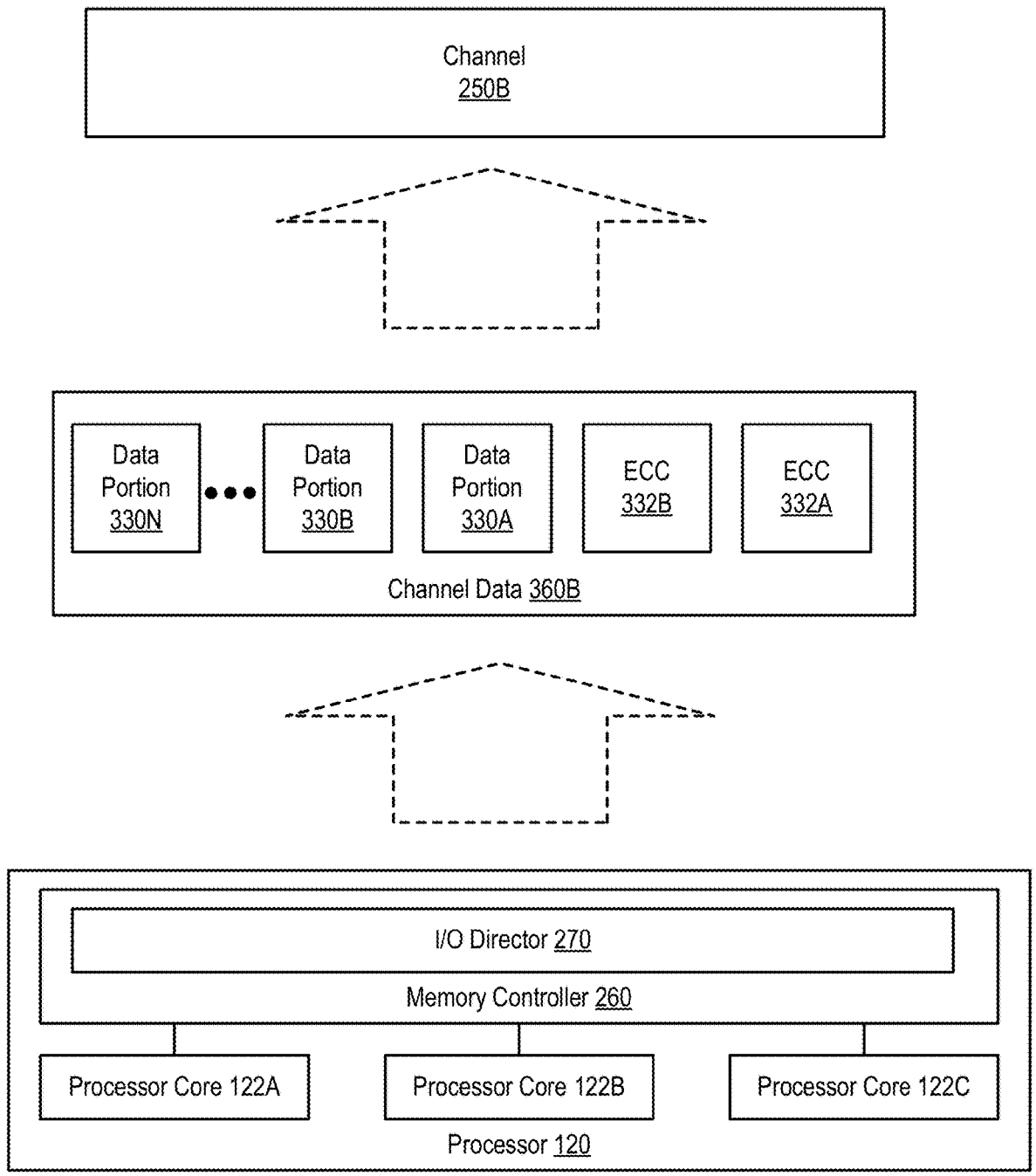

Turning now to FIGS. 3A and 3B, examples of channel data are illustrated, according to one or more embodiments. As shown, processor 120 may provide channel data 360A to channel 250A. As illustrated, channel data 360A may include data portions 320A-320N and ECCs 322A and 322B. In one example, data portions 320A-320N may be provided to MUs 220A-220N, respectively. In another example, ECCs 322A and 322B may be provided to MUs 222A and 222B, respectively. In one or more embodiments, ECCs 322A and 322B may form a single error correction code. For example, the single error correction code may be an eight-bit error correction code. In one instance, ECC 322A may be or include a first portion (e.g., a first four bits) of the single error correction code. In another instance, ECC 322B may be or include a second portion (e.g., a second four bits) of the single error correction code.

As shown, processor 120 may provide channel data 360B to channel 250B. As illustrated, channel data 360B may include data portions 330A-330N and ECCs 332A and 332B. In one example, data portions 330A-330N may be provided to MUs 230A-230N, respectively. In another example, ECCs 332A and 332B may be provided to MUs 232A and 232B, respectively. In one or more embodiments, ECCs 332A and 332B may form a single error correction code. For example, the single error correction code may be an eight-bit error correction code. In one instance, ECC 332A may be or include a first portion (e.g., a first four bits) of the single error correction code. In another instance, ECC 332B may be or include a second portion (e.g., a second four bits) of the single error correction code.

In one or more embodiments, if a memory unit that stores data fails or malfunctions, a memory unit that is utilized with an error correction code may be utilized to store data. For example, if MU 220B fails or malfunctions, a MU of MUs 222A and 222B may be utilized to store data. In one or more embodiments, utilizing a memory unit, which is utilized with an error correction code, to store data may weaken a strength of an error correction code of a channel. For example, if MU 222A is utilized to store data, a strength of an error correction code of channel 250A may be weakened. For instance, if MUs 222A and 222B are utilized with an eight-bit error correction code associated with channel 250A, a four-bit error correction code may be utilized and/or associated with channel 250A. In one or more embodiments, a four-bit error correction code may be of less strength than an eight-bit error correction code.

If MU 220B fails or malfunctions, for example, MU 222A may be utilized to store data in place of MU 220B. In one instance, ECC 322A may include data that may have been included via data portion 320B. In a second instance, data portion 320B may include data that may have been included via data portion 320B as if MU 220B had not failed or malfunctioned. In another instance, data portion 320B may include "do not care" data (e.g., random data, unspecified data, data that will be ignored, etc.). In one or more embodiments, ECC 322B may include an error correction code for data of channel data 360A. For example, ECC 322B may or include a four-bit error correction code for data portions 320A, 320C-320N, and ECC 322A, which may include data that would have been included via data portion 320B if MU 222B had not failed or malfunctioned. In one or more embodiments, utilizing a MU 222 in place of MU 220B may be based at least on a distance. In one example, the distance may be or include a physical distance. For instance, the physical distance may be between MU 222 and CD 240. In another example, the distance may be or include an electrical distance. For instance, the electrical distance may be or include one or more lengths of one or more couplings between MU 222 and CD 240.

In one or more embodiments, if two memory units that store data fail or malfunction, multiple memory units that are utilized with an error correction code may be utilized to store data. For example, if MUs 220A and 220B fail or malfunction, a MU of MUs 232A and 232B may be utilized to store data. For example, a MU of MUs 222A and 222B may be utilized to store data, and a MU of MUs 232A and 232B may be utilized to store data. For instance, a MU of MUs 222A and 222B may be utilized in place of MU 220B, and a MU of MUs 232A and 232B may be utilized in place of 220A. In one or more embodiments, utilizing a memory unit, which is utilized with an error correction code, to store data may weaken a strength of an error correction code of a channel. For example, if MU 232A is utilized to store data, a strength of an error correction code of channel 250B may be weakened. For instance, if MUs 232A and 232B are utilized with an eight-bit error correction code associated with channel 250B, a four-bit error correction code may be utilized and/or associated with channel 250B. In one or more embodiments, a four-bit error correction code may be of less strength than an eight-bit error correction code.

If MUs 220A and 220B fail or malfunction, for example, MU 222A may be utilized to store data in place of MU 222A and MU 232A may be utilized in place of MU 220A. In one instance, ECC 320B may include data that may have been included via data portion 320B. In a second instance, data portion 320B may include data that may have been included via data portion 320B as if MU 220B had not failed or malfunctioned. In a third instance, data portion 320B may include "do not care" data (e.g., random data, unspecified data, data that will be ignored, etc.). In a fourth instance, ECC 332A may include data that may have been included via data portion 320A. In a fifth instance, data portion 320A may include data that may have been included via data portion 320A as if MU 220A had not failed or malfunctioned. In another instance, data portion 320A may include "do not care" data (e.g., random data, unspecified data, data that will be ignored, etc.). In one or more embodiments, ECC 322B may include an error correction code for data of channel data 360A. For example, ECC 322B may or include a four-bit error correction code for data portions 320A, 320C-320N, and ECC 322A, which may include data that would have been included via data portion 320B if MU 222B had not failed or malfunctioned. In one or more embodiments, ECC 332B may include an error correction code for data of channel data 360B. For example, ECC 332B may or include a four-bit error correction code for data portions 330A-330N.

Figure 4:
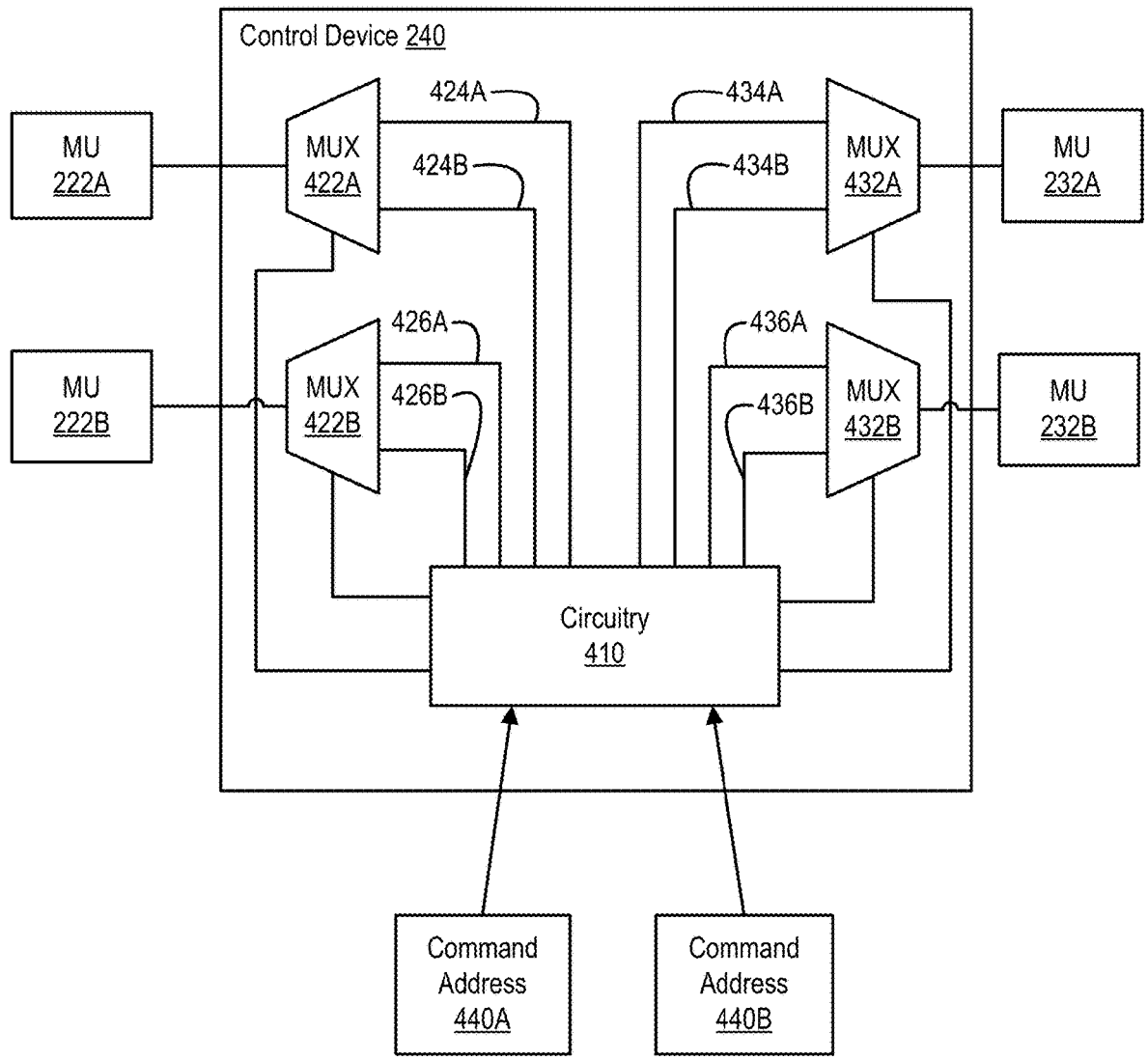
FIG. 4 illustrates an example of a control device, according to one or more embodiments.

Turning now to FIG. 4, an example of a control device is illustrated, according to one or more embodiments. As shown, CD 240 may circuitry 410. As illustrated, CD 240 may include one or more multiplexers (MUXes) 422A and 422B and MUXes 432A and 432B coupled to circuitry 410. As illustrated, command address lines 424A and 424B may be coupled to MUX 422A, and command address lines 426A and 426B may be coupled to MUX 422B. As shown, command address lines 434A and 434B may be coupled to MUX 432A, and command address lines 436A and 436B may be coupled to MUX 432B. As illustrated, command address lines 424A, 424B, 426A, 426B, 434A, 434B, 436A, and 436B may be coupled to circuitry 410. In one or more embodiments, command address lines 424A, 426A, 434B, and 436B may be associated with command address 440A. For example, circuitry 410 may provide command address 440A to one or more of command address lines 424A, 426A, 434B, and 436B. For instance, circuitry 410 may buffer command address 440A. In one or more embodiments, command address lines 424B, 426B, 434A, and 436A may be associated with command address 440B. For example, circuitry 410 may provide command address 440B to one or more of command address lines 424B, 426B, 434A, and 436A. For instance, circuitry 410 may buffer command address 440B.

In one example, circuitry 410 may utilize MUX 422A to select a command address line to utilize MU 222A with a data portion associated with channel 250A or 250B. In one instance, circuitry 410 may utilize MUX 422A to select command address line 424A to utilize MU 222A in place of a MU of MUs 220A-220N. In another instance, circuitry 410 may utilize MUX 422A to select command address line 424B to utilize MU 222A in place of a MU of MUs 230A-230N. In a second example, circuitry 410 may utilize MUX 422B to select a command address line to utilize MU 222B with a data portion associated with channel 250A or 250B. In one instance, circuitry 410 may utilize MUX 422B to select command address line 426A to utilize MU 222B in place of a MU of MUs 220A-220N. In another instance, circuitry 410 may utilize MUX 422B to select command address line 426B to utilize MU 222B in place of a MU of MUs 230A-230N. In a third example, circuitry 410 may utilize MUX 432A to select a command address line to utilize MU 232A with a data portion associated with channel 250A or 250B. In one instance, circuitry 410 may utilize MUX 432A to select command address line 434A to utilize MU 232A in place of a MU of MUs 220A-220N. In another instance, circuitry 410 may utilize MUX 432A to select command address line 434B to utilize MU 232A in place of a MU of MUs 230A-230N. In another example, circuitry 410 may utilize MUX 432B to select a command address line to utilize MU 232B with a data portion associated with channel 250A or 250B. In one instance, circuitry 410 may utilize MUX 432B to select command address line 436A to utilize MU 232B in place of a MU of MUs 220A-220N. In another instance, circuitry 410 may utilize MUX 432B to select command address line 436B to utilize MU 232B in place of a MU of MUs 230A-230N.

In one or more embodiments, circuitry 410 may receive multiple command addresses. In one example, circuitry 410 may receive a command address 440A. In another example, circuitry 410 may receive a command address 440B. In one or more embodiments, circuitry 410 may configure one or more of MUXes 422A, 422B, 432A, and 432B based at least on one or more command addresses. In one or more embodiments, circuitry 410 may be or include one or more of a complex logic device, a buffer, a FPGA, a processor, and an ASIC, among others.

In one or more embodiments, a command address 440 may include an address. In one or more embodiments, a command address 440 may include a command. In one or more embodiments, CD 240 may provide one or more command addresses to one or more memory units. In one example, CD 240 may provide command address 440A to one or more of MUs 220A-220N, 222A, and 222B. In another example, CD 240 may provide command address 440B to one or more of MUs 230A-230N, 232A, and 232B. In one or more embodiments, CD 240 may receive a command address, which may include an address, and CD 240 may route the address to one or more memory units. In one example, CD 240 may an address of command address 440A to one or more of MUs 220A-220N, 222A, and 222B. In another example, CD 240 may an address of command address 440B to one or more of MUs 230A-230N, 232A, and 232B.

In one or more embodiments, CD 240 may be configured to receive a first command address. For example, the first command address may configure MUX 422 to provide command addresses associated with channel 250A to MU 222. In one or more embodiments, CD 240 may be configured to receive a second command address. For example, the second command address may configure MUX 432 to provide command addresses associated with channel 250A to MU 232. For instance, the first command address and the second command address may respectively configure MUXes 422 and 432 to provide addresses associated with channel 250A to respective MUs 222 and 232.

Figures 5, 6:
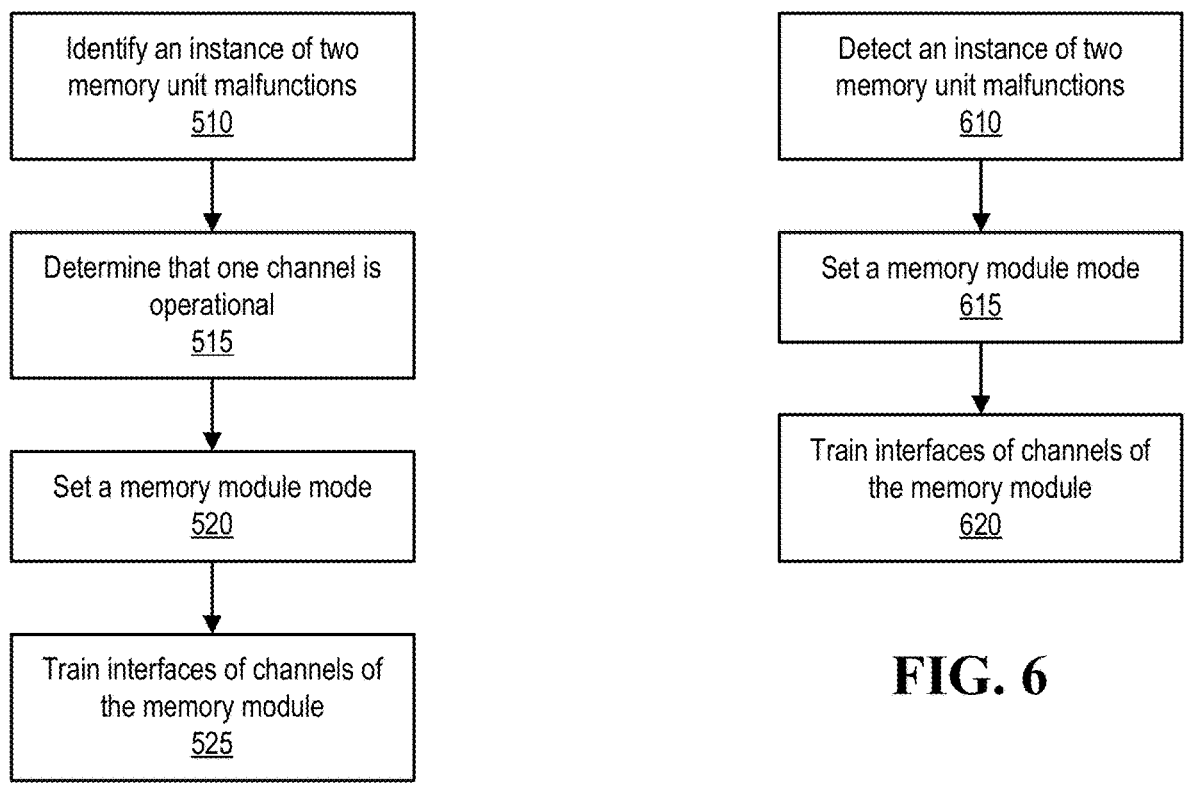
FIG. 5 illustrates an example of a method of operating a one or more components of an information handling system, according to one or more embodiments.
FIG. 6 illustrates a second example of a method of operating a one or more components of an information handling system, according to one or more embodiments.

Turning now to FIG. 5, an example of a method of operating a one or more components of an information handling system is illustrated, according to one or more embodiments. At 510, an instance of two memory unit malfunctions may be identified. For example, IHSFW 172 may identify an instance of two memory unit malfunctions. In one or more embodiments, the two memory unit malfunctions may occur on a same channel. For example, the two memory unit malfunctions may occur on channel 250A. At 515, it may be determined that determined that one channel is operational. For example, IHSFW 172 may determine that determined that one channel is operational. For instance, it may be determined that channel 250B is operational.

At 520, a memory module mode may be set. For example, IHSFW 172 may set a memory module mode. In one or more embodiments, setting a memory module mode may include utilizing other memory units in place of the two memory units that were identified as malfunctioning. For example, MUs 222A and 232A may be utilized in place of two of MUs 220A-220N. At 525, interfaces of channels of the memory module may be trained. For example, memory controller 260 may be trained. In one instance, training memory controller 260 may include configuring I/O director 270 to provide at least a portion of data, associated with channel 250A, to channel 250B. In another instance, training memory controller 260 may include configuring I/O director 270 to receive at least a portion of data, associated with channel 250A, from channel 250B. In one or more embodiments, I/O director 270 may include a multiplexer layer. For example, the multiplexer layer may be configured to provide at least a portion of data, associated with channel 250A, to channel 250B. In one or more embodiments, I/O director 270 may include a communication fabric. For example, the communication fabric may be configured to provide at least a portion of data, associated with channel 250A, to channel 250B.

Turning now to FIG. 6, a second example of a method of operating a one or more components of an information handling system is illustrated, according to one or more embodiments. In one or more embodiments, method elements 610-620 may be performed in accordance with method elements 510, 520, and 525, respectively.

In one or more embodiments, the method illustrated with reference to FIG. 5 may be performed at a boot time. In one or more embodiments, the method illustrated with reference to FIG. 6 may be performed at run time.

Figure 7:
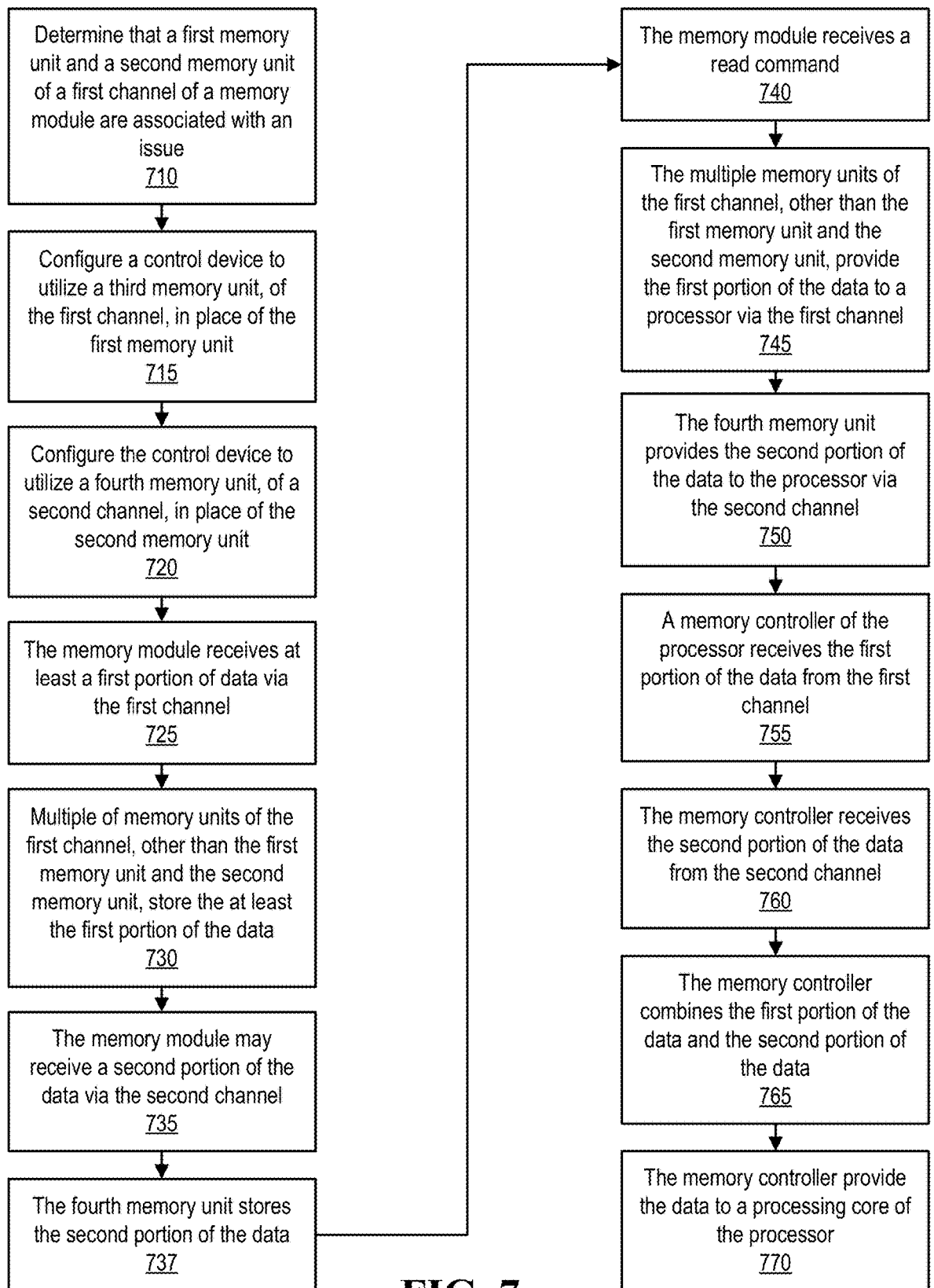
FIG. 7 illustrates a third example of a method of operating a one or more components of an information handling system, according to one or more embodiments.

Turning now to FIG. 7, a third example of a method of operating a one or more components of an information handling system is illustrated, according to one or more embodiments. At 710, it may be determined that a first memory unit and a second memory unit of a first channel of a memory module are associated with an issue. For example, it may be determined that MUs 220A and 220B of channel 250A of memory module 210 are associated with an issue. In one or more embodiments, determining that that the first memory unit and the second memory unit are associated with the issue may include determining that the first memory unit and the second memory unit have malfunctioned or have failed. In one example, the first memory unit may have malfunctioned or may have failed. In another example, the second memory unit may have malfunctioned or may have failed.

In one or more embodiments, a message may be provided in response to determining that the first memory unit and the second memory unit are associated with the issue. In one example, the message may be or include illuminating a light emitting diode (LED). For instance, the LED may be blinked. In a second example, the message may be or include information that may be provided to an operating system. For instance, the message may be provided to OS 162 via one or more of WMI and CIM, among others. In another example, the message may be or include information that may be provided to a service entity of an information handling system. For instance, a text message, an email, and/or another information carrying medium and/or method may be utilized in providing information associated with the issue to a service entity of IHS 110.

At 715, a control device may be configured to utilize a third memory unit, of the first channel, in place of the first memory unit. For example, CD 240 may be configured to utilize MU 222A in place of MU 220A. In one or more embodiments, configuring the control device to utilize the third memory unit, of the first channel, in place of the first memory unit may include configuring one or more MUXes of CD 240. For example, configuring CD 240 to utilize MU 222A, of channel 250A, in place of MU 220A may include configuring MUX 422A. For instance, MUX 422A may be configured from providing at least portions of respective error correction codes to providing at least portions of data to MU 422A. In one or more embodiments, utilizing a MU 222 in place of MU 220A may be based at least on a distance. In one example, the distance may be or include a physical distance. For instance, the physical distance may be between MU 222 and CD 240. In another example, the distance may be or include an electrical distance. For instance, the electrical distance may be or include one or more lengths of one or more couplings between MU 222 and CD 240.

At 720, the control device may be configured to utilize a fourth memory unit, of a second channel of the memory module, in place of the second memory unit. For example, CD 240 may be configured to utilize MU 232A in place of MU 220B. In one or more embodiments, configuring the control device to utilize the fourth memory unit, of the second channel, in place of the second memory unit may include configuring one or more MUXes of CD 240. For example, configuring CD 240 to utilize MU 232A, of channel 250B, in place of MU 220B may include configuring MUX 432A. For instance, MUX 432A may be configured from providing at least portions of respective error correction codes to providing at least portions of data to MU 432A. In one or more embodiments, method elements 715 and 720 may be performed in response to determining that the first memory unit and the second memory unit are associated with the issue. In one or more embodiments, utilizing a MU 232 in place of MU 220B may be based at least on a distance. In one example, the distance may be or include a physical distance. For instance, the physical distance may be between MU 232 and CD 240. In another example, the distance may be or include an electrical distance. For instance, the electrical distance may be or include one or more lengths of one or more couplings between MU 232 and CD 240.

At 725, the memory module may receive at least a first portion of data via the first channel. For example, memory module 210 may receive at least a first portion of data via channel 250A. In one instance, memory module 210 may receive thirty-two bits of data via channel 250A. In another instance, memory module 210 may receive twenty-eight of the thirty-two bits of data via channel 250A. In one or more embodiments, some of the data may include "do not care" data (e.g., random data, unspecified data, data that will be ignored, etc.). For example, a portion of the data that may have been provided to MU 220B may be or include "do not care" data (e.g., random data, unspecified data, data that will be ignored, etc.).

At 730, multiple of memory units of the first channel, other than the first memory unit and the second memory unit, may store the at least the first portion of the data. For example, MUs 220C-220N may store the at least the first portion of the data. At 735, the memory module may receive a second portion of the data via the second channel. For example, memory module 210 may receive a second portion of the data via channel 250B. At 737, the fourth memory unit may store the second portion of the data. For example, MU 232A may store the second portion of the data.

At 740, the memory module may receive a read command. For example, memory module 210 may receive a read command. In one or more embodiments, module 210 may receive a read command via one or more command addresses. In one example, module 210 may receive command address 440A that includes the read command. In another example, module 210 may receive command address 440B that includes the read command. In one or more embodiments, the read command may include an address associated with the data.

At 745, the multiple memory units of the first channel, other than the first memory unit and the second memory unit, may provide the first portion of the data to a processor via the first channel. For example, MUs 220C-220N may provide the first portion of the data to processor 120 via channel 250A. At 750, the fourth memory unit may provide the second portion of the data to the processor via the second channel. For example, MU 232A may provide the second portion of the data to processor 120 via channel 250B. At 755, a memory controller of the processor may receive the first portion of the data from the first channel. For example, memory controller 260 may receive the first portion of the data from channel 250A.

At 760, the memory controller may receive the second portion of the data from the second channel. For example, memory controller 260 may receive the second portion of the data from channel 250B. At 765, the memory controller may combine the first portion of the data and the second portion of the data. For example, memory controller 260 may combine the first portion of the data and the second portion of the data. For instance, I/O director 270 may combine the first portion of the data and the second portion of the data. In one or more embodiments, I/O director 270 may be configured to combine the first portion of the data and the second portion of the data. For example, I/O director 270 may be configured to combine the first portion of the data and the second portion of the data in response to determining that the first memory unit and the second memory unit are associated with the issue. At 770, the memory controller may provide the data to a processing core of the processor. For example, memory controller 260 may provide the data to a processor core of processor cores 122A-122C.

Figure 8:
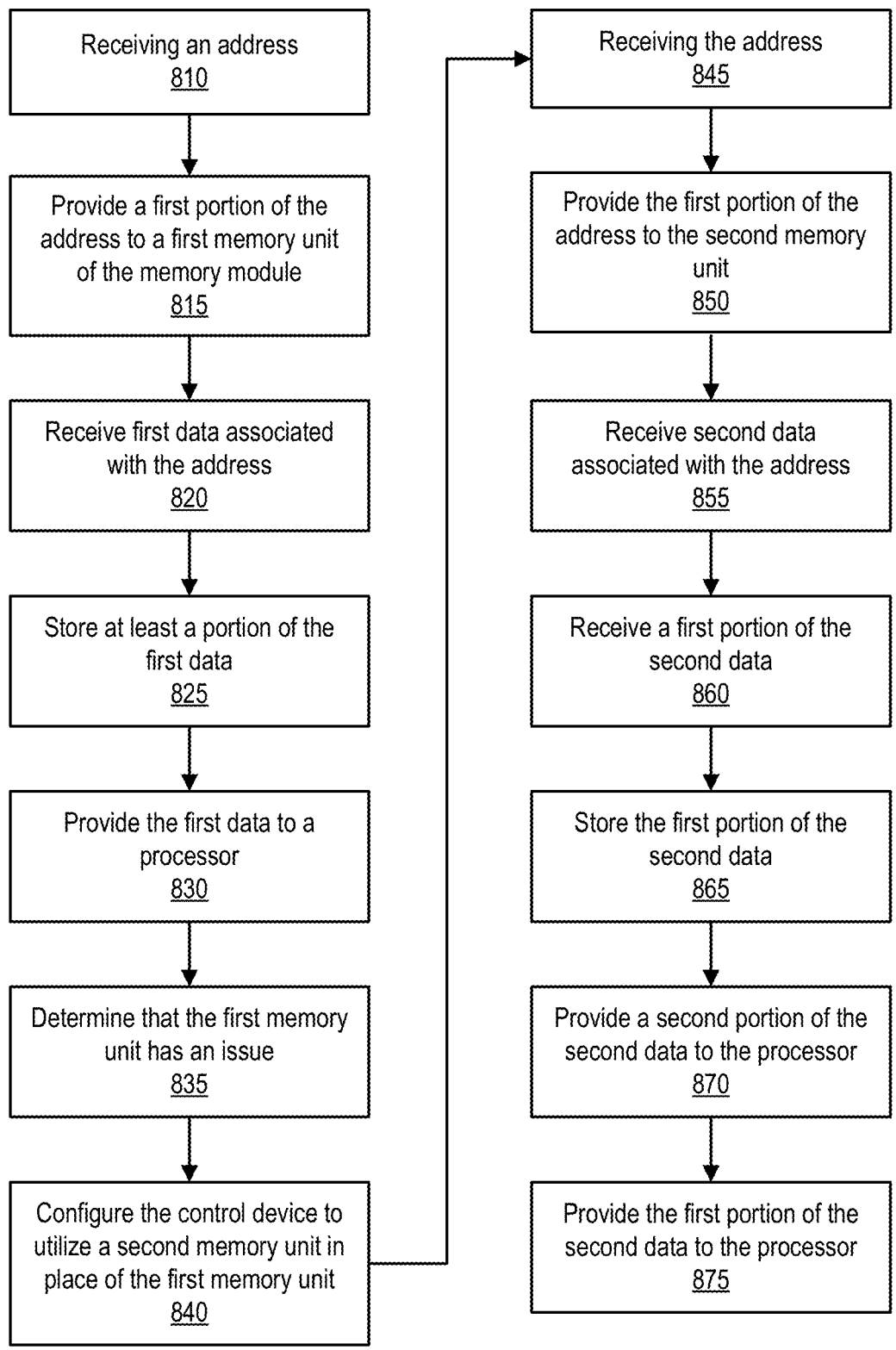
FIG. 8 illustrates another example of a method of operating a one or more components of an information handling system, according to one or more embodiments.

Turning now to FIG. 8, another example of a method of operating a one or more components of an information handling system is illustrated, according to one or more embodiments. At 810, an address may be received. For example, a control device of a memory module may receive an address. For instance, CD 240 of memory module 210 may receive an address. At 815, a first portion of the address may be provided to a first memory unit of the memory module. For example, CD 240 may provide a first portion of the address to MU 220B. At 820, first data associated with the address may be received. For example, a first channel of the memory module may receive first data associated with the address. For instance, channel 250A may receive first data associated with the address.

At 825, at least a portion of the first data may be stored. For example, the first memory unit may store at least a portion of the first data. For instance, MU 220B may store at least a portion of the first data. At 830, the first data may be provided to a processor via the first channel. For example, channel 250A may provide the first data to processor 120. At 835, it may be determined that the first memory unit has an issue. For example, it may be determined that MU 220B has an issue. In one or more embodiments, determining that the first memory unit has an issue may include determining that the first memory unit is malfunctioning or has failed.

At 840, the control device may be configured to utilize a second memory unit of the memory module in place of the first memory unit. In one example, CD 240 may be configured to utilize MU 222A in place of MU 220B. In another example, CD 240 may be configured to utilize MU 232A in place of MU 220B. In one or more embodiments, configuring the control device to utilize the second memory unit in place of the first memory unit may include configuring one or more MUXes of the control device. In one example, configuring CD 240 to utilize MU 222A in place of MU 220B may include configuring MUX 422A. In another example, configuring CD 240 to utilize MU 232A in place of MU 220B may include configuring MUX 432A. In one or more embodiments, one or more MUXes may be configured to route data to and/or from the second memory unit. For example, the second memory unit may be a memory unit of a second channel of the memory device. For instance, MU 232A may be a memory unit of channel 250B, and one or more MUXes may be configured to route data to and/or from MU 232A.

At 845, the address may be received. For example, the control device may receive the address (e.g., the address received at 810). For instance, CD 240 may receive the address. At 850, the first portion of the address may be provided to the second memory unit. In one example, CD 240 may provide the first portion of the address to MU 222A. In another example, CD 240 may provide the first portion of the address to MU 232A.

At 855, second data associated with the address. For example, channel 250A may receive the second data associated with the address. In one or more embodiments, the second data may be different from the first data. In one or more embodiments, the second data may be the first data. In one or more embodiments, receiving the second data associated with the address may include receiving an error correction code associated with the second data. For example, the error correction code may be or include a four-bit error correction code. For instance, channel 250A may have received eight-bit error correction codes before it was determined that MU 220B had the issue. At 860, a first portion of the second data may be received. For example, a second channel of the memory module may receive a first portion of the second data. For instance, channel 250B may receive a first portion of the second data.

At 865, the first portion of the second data may be stored. For example, the second memory unit may store the first portion of the second data. In one instance, MU 222A may store the first portion of the second data. In one instance, MU 232A may store the first portion of the second data. At 870, a second portion of the second data may be provided to the processor. For example, channel 250A may provide a second portion of the second data to processor 120. For instance, the second portion of the data may include data from MUs 220A and 220C-220N. At 875, the first portion of the second data may be provided to the processor. In one example, channel 250B provide the second portion of the second data to processor 120. For instance, MU 232A may provide the second portion of the second data to processor 120. In another example, channel 250A provide the second portion of the second data to processor 120. For instance, MU 222A may provide the second portion of the second data to processor 120. In one or more embodiments, method elements 840-875 may be performed after determining that the first memory unit has the issue.

In one or more embodiments, one or more of the method and/or process elements and/or one or more portions of a method and/or processor elements may be performed in varying orders, may be repeated, or may be omitted. Furthermore, additional, supplementary, and/or duplicated method and/or process elements may be implemented, instantiated, and/or performed as desired, according to one or more embodiments. Moreover, one or more of system elements may be omitted and/or additional system elements may be added as desired, according to one or more embodiments.

In one or more embodiments, a memory medium may be and/or may include an article of manufacture. For example, the article of manufacture may include and/or may be a software product and/or a program product. For instance, the memory medium may be coded and/or encoded with processor-executable instructions in accordance with one or more flowcharts, systems, methods, and/or processes described herein to produce the article of manufacture.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. An information handling system, comprising:
   at least one processor;
   a memory medium that is coupled to the at least one processor, that includes instructions executable by the at least one processor, and that includes one or more memory modules;
   wherein the instructions, when executed by the at least one processor, cause the information handling system to:
   determine that a first memory unit and a second memory unit of a first channel, of a memory module of the one or more memory modules, are associated with an issue;
   in response to determining that the first memory unit and the second memory unit are associated with the issue:
   configure a control device of the memory module to utilize a third memory unit, of the first channel, in place of the first memory unit; and
   configure the control device to utilize a fourth memory unit, of a second channel of the memory module, in place of the second memory unit;
   wherein the memory module is configured to:
   receive at least a first portion of data via the first channel;
   store the at least the first portion of the data via a plurality of memory units of the first channel, other than the first memory unit and the second memory unit;
   receive a second portion of the data via the second channel;
   store the second portion of the data via the fourth memory unit;

receive a read command; and in response to the memory module receiving the read command:

provide the first portion of the data to the at least one processor via the plurality of memory units of the first channel, other than the first memory unit and the second memory unit, via the first channel; and provide the second portion of the data to the at least one processor via the fourth memory unit and the second channel.

2. The information handling system of claim 1, wherein, before determining that the first memory unit and the second memory unit are associated with the issue, the third memory module was utilized with error codes associated with the first channel and the fourth memory module was utilized with error codes associated with the second channel.

3. The information handling system of claim 2, wherein, to configure the control device to utilize the third memory unit in place of the first memory unit, the instructions further cause the information handling system to configure a first multiplexer coupled to the third memory module to provide a command address to the third memory unit; and wherein, to configure the control device to utilize the fourth memory unit in place of the second memory unit, the instructions further cause the information handling system to configure a second multiplexer coupled to the fourth memory module to provide the command address to the fourth memory unit.

4. The information handling system of claim 2, wherein, before configuring the control device to utilize the fourth memory unit in place of the second memory unit, the error codes associated with the second channel were of a first strength; and wherein, after configuring the control device to utilize the fourth memory unit in place of the second memory unit, additional error codes associated with the second channel are of a second strength, lesser than the first strength.

5. The information handling system of claim 1, wherein the at least one processor includes a memory controller; and wherein the memory controller is configured to:

receive the first portion of the data from the first channel;

receive the second portion of the data from the second channel;

combine the first portion of the data and the second portion of the data; and provide the data to a processor core of the at least one processor.

6. The information handling system of claim 5, wherein the instructions further cause the information handling system to configure an input/output director of the memory controller to combine the first portion of the data and the second portion of the data, in response to determining that the first memory unit and the second memory unit are associated with the issue.

7. The information handling system of claim 6, wherein the memory controller is further configured to receive the data from the processing core; and wherein the input/output director is configured to:

provide the at least the first portion of data to the memory module via the first channel; and provide the second portion of data to the memory module via the second channel.

8. A method, comprising:

determining that a first memory unit and a second memory unit of a first channel of a memory module are associated with an issue;

in response to the determining that the first memory unit and the second memory unit are associated with the issue:

configuring a control device to utilize a third memory unit, of the first channel, in place of the first memory unit; and configuring the control device to utilize a fourth memory unit, of a second channel of the memory module, in place of the second memory unit;

the memory module receiving at least a first portion of data via the first channel;

a plurality of memory units of the first channel, other than the first memory unit and the second memory unit, storing the at least the first portion of the data;

the memory module receiving a second portion of the data via the second channel;

the fourth memory unit storing the second portion of the data;

the memory module receiving a read command; and in response to the memory module receiving the read command:

the plurality of memory units of the first channel, other than the first memory unit and the second memory unit, providing the first portion of the data to a processor via the first channel; and the fourth memory unit providing the second portion of the data to the processor via the second channel.

9. The method of claim 8, wherein, before the determining that the first memory unit and the second memory unit are associated with the issue, the third memory module was utilized with error codes associated with the first channel and the fourth memory module was utilized with error codes associated with the second channel.

10. The method of claim 9, wherein the configuring the control device to utilize the third memory unit in place of the first memory unit includes configuring a first multiplexer coupled to the third memory module to provide a command address to the third memory unit; and wherein the configuring the control device to utilize the fourth memory unit in place of the second memory unit includes configuring a second multiplexer coupled to the fourth memory module to provide the command address to the fourth memory unit.

11. The method of claim 9, wherein, before the configuring the control device to utilize the fourth memory unit in place of the second memory unit, the error codes associated with the second channel were of a first strength; and wherein, after the configuring the control device to utilize the fourth memory unit in place of the second memory unit, additional error codes associated with the second channel are of a second strength, lesser than the first strength.

12. The method of claim 8, further comprising:

a memory controller of the processor receiving the first portion of the data from the first channel;

the memory controller receiving the second portion of the data from the second channel;

the memory controller combining the first portion of the data and the second portion of the data; and the memory controller providing the data to a processor core of the processor.

13. The method of claim 12, further comprising:
in response to the determining that the first memory unit and the second memory unit are associated with the issue, configuring an input/output director of the memory controller to combine the first portion of the data and the second portion of the data.

14. The method of claim 13, further comprising:
the memory controller receiving the data from the processing core;
the input/output director providing the at least the first portion of data to the memory module via the first channel; and
the input/output director providing the second portion of data to the memory module via the second channel.

15. A memory module, comprising:
a plurality of memory modules associated with a first channel;
a first error correction code memory unit associated with the first channel;
a second error correction code memory unit associated with a second channel;
a control device coupled to the plurality of memory modules, the first error correction code memory unit, and the second error correction code memory unit;
wherein the memory module is configured to:
configure the control device to utilize the first error correction code memory unit in place of a first memory unit of the plurality of memory units; and
configure the control device to utilize the second error correction code memory unit in place of the second memory unit;
receive at least a first portion of data via the first channel;
store the at least the first portion of the data via the plurality of memory units of the first channel, other than the first memory unit and the second memory unit;
receive a second portion of the data via the second channel;
store the second portion of the data via the second error correction code memory unit;
receive a read command; and
in response to receiving the read command:
provide the first portion of the data to the a processor via the plurality of memory units of the first channel, other than the first memory unit and the second memory unit, via the first channel; and
provide the second portion of the data to the processor via the second error correction code memory unit and the second channel.

16. The memory module of claim 15,
wherein the control device includes a plurality of multiplexers;
wherein, to configure the control device to utilize the first error correction code memory unit in place of the first memory unit of the plurality of memory units, the memory module is further configured to configure a first multiplexer of plurality of multiplexers to provide a command address to the first error correction code memory unit; and
wherein, to configure the control device to utilize the second error correction code memory unit in place of the second memory unit, the memory module is further configured to configure a second multiplexer of plurality of multiplexers to provide the command address to the second error correction code memory unit.

17. The memory module of claim 15, further comprising:
a plurality of error correction code memory units that include the second error correction code memory unit and that are associated with the second channel; and
wherein, before configuring the control device to utilize the second error correction code memory unit in place of the second memory unit, error codes associated with the second channel were of a first strength; and
wherein, after configuring the control device to utilize the second error correction code memory unit in place of the second memory unit, additional error codes associated with the second channel are of a second strength, lesser than the first strength.

18. The memory module of claim 15, wherein the memory module is a dual in-line memory module.

19. The memory module of claim 15, wherein the control device is further configured to:
receive a command address associated with the data; and
provide at least a portion of the command address to the second error correction code memory unit.

20. The memory module of claim 15,
wherein the control device includes a plurality of multiplexers;
wherein the control device is further configured to:
receive a first command address; and
receive a second command address;
configure, based at least on the first command address, a first multiplexer of plurality of multiplexers to provide command addresses associated with the first channel to the first error correction code memory unit; and
configure, based at least on the second command address, a second multiplexer of plurality of multiplexers to provide the command addresses associated with the first channel to the second error correction code memory unit.

* * * * *